United States Patent
Niederkorn et al.

(10) Patent No.: US 6,423,961 B1
(45) Date of Patent: Jul. 23, 2002

(54) PIXEL READOUT SWITCHED CAPACITOR BUFFER CIRCUIT AND METHOD THEREFOR

(75) Inventors: Andrea Niederkorn, Tempe; Suhail Agwani; David LoCascio, both of Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/490,238

(22) Filed: Jan. 24, 2000

(51) Int. Cl.[7] .................................................. H01J 40/14
(52) U.S. Cl. ............................. 250/214 LA; 250/208.1
(58) Field of Search ...................... 250/214 LA, 208.1, 250/214 A, 214 R; 257/291, 290; 348/294, 297, 298, 300, 301, 302, 311

(56) References Cited

U.S. PATENT DOCUMENTS 6,128,039 A * 10/2000 Chen et al. ................. 348/294

\* cited by examiner

Primary Examiner—Que T. Le
(74) Attorney, Agent, or Firm—Mark J. Fink

(57) ABSTRACT

A pixel signal amplification circuit (200) receives a signal from a pixel element. A first semiconductor switch (225a) is connected to the pixel element and transfers a reset value of the pixel signal to a first storage capacitor (C1). A second semiconductor switch (235a) is also connected to the pixel element and transfers a sampled pixel signal to a second storage capacitor (C3). A differential voltage amplifier (OP1) generates an amplified signal of the difference between the values stored on the first and second storage capacitors (C1 and C3).

17 Claims, 1 Drawing Sheet

PIXEL READOUT SWITCHED CAPACITOR BUFFER CIRCUIT AND METHOD THEREFOR

BACKGROUND OF THE INVENTION

This invention relates generally to solid state imager circuits, and, more specifically, to pixel readout and buffer circuits utilizing switched capacitors to achieve an improved signal-to-noise ratio and improved signal gain.

The primary function of a solid state imager is the sensing of photons, and the conversion of their energy to a measurable electrical voltage signal. Typically, the voltage generated by moving charge from a photodiode to a capacitive node in a pixel element is sensed. A reset operation is applied to each pixel element to determine a reference level for each diode in the array of pixel elements. Following the pixel reset operation, the pixel elements are again sequenced to read a sampled pixel signal. The difference between the sampled pixel signal and the reference level is determined for each pixel element in the array.

The primary performance parameter for an active pixel sensor, whether used for charged particle spectrometry, or for imaging, is the signal-to-noise ratio. The noise can be divided into spatial, temporal and detection components. The spatial, or Fixed Pattern Noise (FPN), is generally the largest noise source and of significant applicability in the present invention.

During the conversion of the captured electron charge to voltage (e– to V), the resulting sampled signal level strength is quite small. Consequently, an amplification, or application of gain, to the resulting sampled signal level is required to obtain a voltage swing having an appreciable dynamic range. Accordingly, it is desirable to apply maximum gain at the signal source to avoid amplifying noise from downstream noise injecting sources.

DETAILED DESCRIPTION OF THE DRAWINGS

The proposed method of this invention eliminates most of the source followers in the column readout circuit by the application of switch capacitor circuitry in the column architecture of a CMOS imager. Switched capacitors do not suffer from the gain loss associated with the use of source follower buffers used in the prior art.

By properly selecting capacitor ratios, gains greater than unity are achieved and the switched capacitor circuitry can be connected close to the pixel signal source, thus further improving the overall signal-to-noise ratio. An improvement in the gain of a pixel sample signal is very desirable for two dimensional photo array image capture devices. The pixel signal levels in this type of device are dependent on local light levels, which may result in signal amplitudes of less than 100 millivolts, resulting in low signal-to-noise ratios. Therefore, it is highly desirable to provide pixel signal gain prior to processing by any downstream noise injecting sources.

In addition, it is easier to maintain constant capacitor ratios than to maintain constant gains in an array of individual source followers. Greater gain mismatch in the source followers shows up in column-to-column noise comparisons, which translates as greater noise. The use of switched capacitors in a circuit, such as shown in FIG. 2, achieves a column-to-column noise performance that is approximately thirty percent lower than the noise performance indicated by the prior art.

The switched capacitors used in the present invention can be applied to other solid-state imager having active pixel sensing elements. For example, a CMOS linear sensor, a Charge Coupled Device (CCD), or other CMOS sensor that utilizes column based readout detection may benefit from the features of the present invention. Such image sensing devices are included in fingerprint authenticators, cameras, retina scanners, and digital and video cameras.

Figure 1:
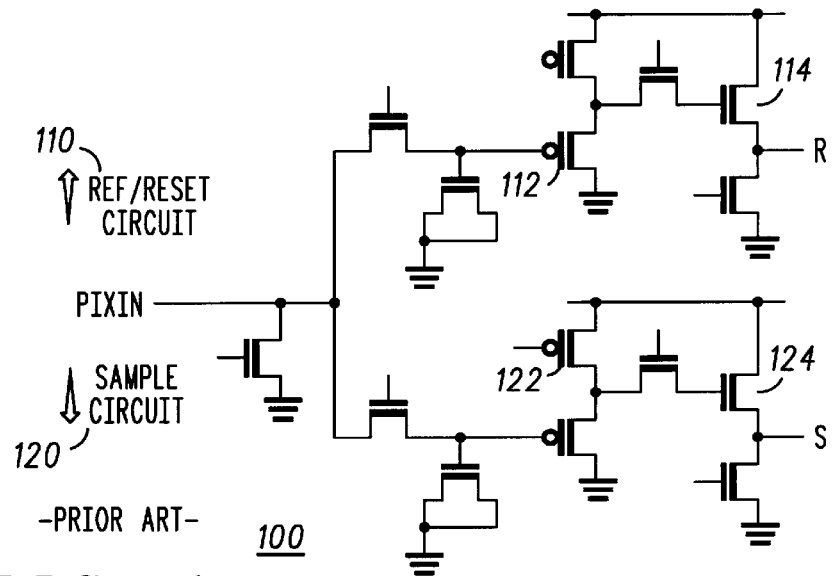
FIG. 1 is a simplified schematic of a prior art image sensor and buffer.

Referring to FIG. 1, a simplified schematic of a prior art image sensor and buffer circuit having a plurality of source follower buffers is shown ("prior art circuit 100" hereinafter). Prior art circuit 100 has a reference reset circuit portion 110 and a sample circuit portion 120. The reference reset circuit portion 110 possesses two common mode 15 source follower switches, i.e., transistors 112 and 114. The sample circuit portion 120 also possesses two common mode source follower switches, i.e., transistors 122 and 124. The two circuit portions 110 and 120 are connected to each other and can be further connected to the output of a pixel element illustrated in FIG. 3, which represents an exemplary pixel input source. Prior art circuit 100 is exemplary of prior art methods of CCD imaging using correlated double sampling.

Figure 2:
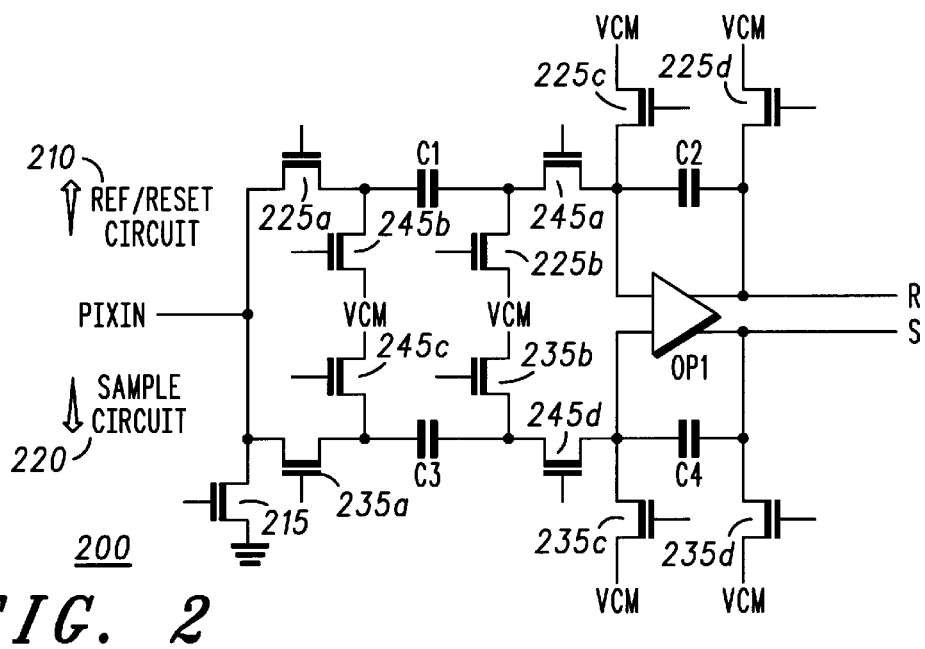
FIG. 2 is a pixel signal amplification circuit in accordance with an embodiment of the present invention.

FIG. 2 is a pixel sensing circuit or pixel signal amplification circuit 200 in accordance with an embodiment of the present invention. Circuit 200 replaces the two circuit portions 110 and 120 of the prior art circuit 100 (FIG. 1) with circuitry that uses switched capacitors.

Circuit 200 includes a reset circuit 210 and a sample signal circuit 220. Circuits 210 and 220 are connected to each other and further connected to the output of the pixel element shown in FIG. 3. The reset circuit 210 includes a reset signal transistor switch 225a that receives the signal PIXIN (FIG. 3) and transfers that signal through a transistor 225a to a terminal of capacitor C1. The other terminal of capacitor C1 is connected through a transistor switch 245a to a first terminal of capacitor C2 and to a first input of a differential operational amplifier OP1. The reference reset circuit 210 includes transistor switches 225c and 225d for connecting both terminals of capacitor C2 to receive a voltage VCM. Transistor switches 225b and 245b connect the terminals of capacitor C1 for receiving the voltage VCM. An output R of OP1 is commonly connected to the second terminal of capacitor C2.

Sample signal circuit 220 further includes a transistor switch 235a that receives the signal PIXIN and transfers that signal to a terminal of capacitor C3. The other terminal of capacitor C3 is connected through a transistor switch 245d to a first terminal of capacitor C4 and further connected to a second input of differential operational amplifier OP1. Sample signal circuit 220 further includes transistor switches 235c and 235d for connecting the terminals of capacitor C4 for receiving the voltage VCM. Transistor switches 235b and 245c connect the terminals of capacitor C3 for receiving the voltage VCM. An output S of OP1 is commonly connected to the second terminal of capacitor C4 and to a terminal of transistor switch 235d. A loading transistor 215 provides a load for the pixel and is connected to the PIXIN source.

The use of a differential operational amplifier ("OpAmp" hereinafter) is advantageous as a fully differential OpAmp is less noisy when used in the circuit 200 than a single ended source follower circuit, as it is not subject to common mode noise. Additionally, as explained in more detail below, the use of OP1 in circuit 200 also provides a voltage gain.

Figure 3:
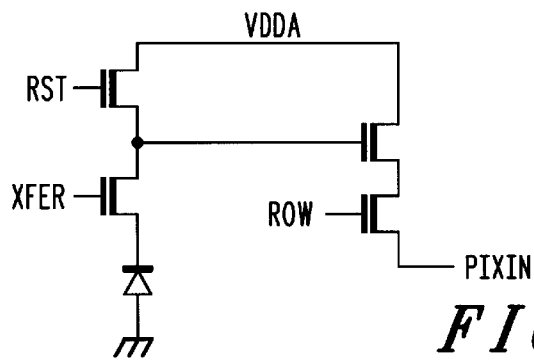
FIG. 3 is a simplified schematic of an exemplary pixel element circuit.

FIG. 3 is a simplified schematic of an exemplary pixel element circuit. The signal RST generates a reset operation that sets the reference voltage across the photodiode in the pixel element. The signal XFER generates a transfer operation and transfers the charge generated across the photodiode, i.e., a sampled value, when light illuminates the pixel element circuit.

In operation, a reference reset operation is first performed on the selected pixel. The signal RST (FIG. 3) sets a voltage value for the signal PIXIN. Transistor switches 225a and 225b are turned on during the reference reset operation and the signal PIXIN is processed by circuit 200. Transistor switch 225a transfers the signal PIXIN to a terminal of capacitor C1. Transistor switch 225b sets a voltage value of VCM at the other terminal of capacitor C1. Thus, the reset value of the signal PIXIN from the pixel element charges capacitor C1. Along with transistor switches 225a and 225b being in a conduction mode, transistor switches 225c and 225d are biased on, connecting both terminals of capacitor C2 for receiving the voltage VCM and equalizing the charge at the terminals of capacitor C2.

The signal RST is then removed from the selected pixel element (FIG. 3) and the signal XFER is asserted. The voltage generated by the photodiode in response to the intensity of light illuminating the pixel element, i.e., a sampled pixel signal value, is transferred to the signal PIXIN at the output of the pixel element. Transistor switches 235a and 235b are turned on in circuit 220 (FIG. 2). Transistor switch 235a transfers the signal PIXIN to a terminal of capacitor C3. Transistor switch 235b sets a voltage value of VCM at the other terminal of capacitor C3. When transistor switches 235a and 235b are in a conduction mode, transistor switches 235c and 235d are also biased on, connecting both terminals of capacitor C4 for receiving the voltage VCM and equalizing the charge at the terminals of capacitor C4.

After circuit 200 receives the reset value from the pixel element for storage on capacitor C1, that charge is further transferred through transistor switch 245a and stored on capacitor C2. The charge transfer is initiated by turning on transistor switches 245a and 245b. Since the voltage across a capacitor can not change instantaneously, the voltage VCM supplied by transistor switch 245b to a terminal of capacitor C1 causes the reset value stored on capacitor C1 to also be the voltage stored on capacitor C2.

In addition, the charge stored on capacitor C3 in response to the intensity of light that illuminated the photodiode in the pixel element is transferred through transistor switch 245d to capacitor C4. The charge transfer from capacitor C3 to capacitor C4 is initiated by switching transistor switches 245c and 245d to a conduction mode.

The pixel element reset value is now stored on capacitor C2 and the voltage generated by light illuminating the pixel element photodiode is now stored on capacitor C4. The voltage difference between the charges stored on capacitors C2 and C4 is amplified by the differential OpAmp OP1 and the amplified output signals R and S are presented at the output of OP1. The signals R and S are available to the next stage (not shown) for further processing as desired. OpAmp OP1 operating with the switched capacitors provides a voltage gain.

By now it should be appreciated that the present invention provides an amplification of the voltage difference between the reset value and the sampled signal level that results when light illuminates the pixel element. The sensing of the voltage difference by an operational amplifier provides a voltage swing having an appreciable dynamic range.

What is claimed is:

1. A pixel signal amplification circuit, comprising:
    an amplifier having first and second inputs and first and second outputs;
    a first capacitor coupled between the first input and the first output of the amplifier;
    a second capacitor coupled between the second input and the second output of the amplifier;
    a third capacitor having a first terminal coupled for receiving a pixel signal and a second terminal coupled to the first input of the amplifier; and
    a fourth capacitor having a first terminal coupled for receiving the pixel signal and a second terminal coupled to the second input of the amplifier.

2. The pixel signal amplification circuit of claim 1, further comprising:
    a first transistor having a first conduction terminal coupled for receiving the pixel signal, a second conduction terminal coupled to the first terminal of the third capacitor, and a control terminal that receives a signal that selects the first transistor for conducting a reset value of the pixel signal; and
    a second transistor having a first conduction terminal coupled for receiving the pixel signal and a second conduction terminal coupled to the first terminal of the fourth capacitor, and a control terminal that receives a signal that selects the second transistor for conducting a sampled pixel signal value.

3. The pixel signal amplification circuit of claim 2, further comprising:
    a third transistor having a first conduction terminal coupled to the second terminal of the third capacitor, a second conduction terminal coupled to the first input of the amplifier, and a control terminal that receives a signal; and
    a fourth transistor having a first conduction terminal coupled to the second terminal of the fourth capacitor, a second conduction terminal coupled to the second input of the amplifier, and a control terminal that receives a signal.

4. The pixel signal amplification circuit of claim 3, further comprising fifth and sixth transistors having first conduction terminals coupled to the respective first and second terminals of the third capacitor and second conduction terminals commonly coupled for receiving a reference voltage.

5. The pixel signal amplification circuit of claim 4, further comprising seventh and eighth transistors having first conduction terminals coupled to the respective first and second terminals of the fourth capacitor and second conduction terminals commonly coupled for receiving the reference voltage.

6. The pixel signal amplification circuit of claim 4, further comprising ninth and tenth transistors having first conduction terminals coupled to the respective first and second terminals of the first capacitor and second conduction terminals commonly coupled for receiving the reference voltage.

7. The pixel signal amplification circuit of claim 4, further comprising eleventh and twelfth transistors having first conduction terminals coupled to the respective first and second terminals of the second capacitor and second conduction terminals commonly coupled for receiving the reference voltage.

8. A pixel sensing circuit, comprising:

an amplifier having first and second inputs and generating a difference value between signals at the first and second inputs;

a first capacitor coupled between the first input and a first output of the amplifier, wherein the first capacitor stores a pixel element reset value; and a second capacitor coupled between the second input and a second output of the amplifier, wherein the second capacitor stores a sampled pixel signal value.

9. The pixel sensing circuit of claim 8, further comprising:

a third capacitor having a first terminal coupled for receiving a pixel signal and a second terminal coupled to the first input of the amplifier; and a fourth capacitor having a first terminal coupled for receiving the pixel signal and a second terminal coupled to the second input of the amplifier.

10. The pixel sensing circuit of claim 9, further comprising:

a first transistor having a first conduction terminal coupled for receiving the pixel signal, a second conduction terminal coupled to the first terminal of the third capacitor, and a control terminal that receives a first signal that selects the first transistor for conducting the pixel element reset value; and a second transistor having a first conduction terminal coupled for receiving the pixel signal and a second conduction terminal coupled to the first terminal of the fourth capacitor, and a control terminal that receives a second signal that selects the second transistor for conducting the sampled pixel signal value.

11. The pixel sensing circuit of claim 10, further comprising:

a third transistor having a first conduction terminal coupled to the second terminal of the third capacitor, a second conduction terminal coupled to the first input of the amplifier, and a control terminal that receives a third signal; and a fourth transistor having a first conduction terminal coupled to the second terminal of the fourth capacitor, a second conduction terminal coupled to the second input of the amplifier, and a control terminal that receives a fourth signal.

12. The pixel sensing circuit of claim 11, further comprising fifth and sixth transistors having first conduction terminals coupled to the respective first and second terminals of the third capacitor and second conduction terminals commonly coupled for receiving a reference voltage.

13. The pixel sensing circuit of claim 12, further comprising seventh and eighth transistors having first conduction terminals coupled to the respective first and second terminals of the fourth capacitor and second conduction terminals commonly coupled for receiving the reference voltage.

14. The pixel sensing circuit of claim 13, further comprising ninth and tenth transistors having first conduction terminals coupled to the respective first and second terminals of the first capacitor and second conduction terminals commonly coupled for receiving the reference voltage.

15. The pixel sensing circuit of claim 14, further comprising eleventh and twelfth transistors having first conduction terminals coupled to the respective first and second terminals of the second capacitor and second conduction terminals commonly coupled for receiving the reference voltage.

16. A method of sensing pixel signals, comprising the steps of:

equalizing charge on terminals of first and second capacitors to a reference voltage;

storing a pixel element reset value on a third capacitor;

storing a sampled pixel signal value on a fourth capacitor;

transferring the pixel element reset value stored on the third capacitor to the first capacitor; and transferring the sampled pixel signal value stored on the fourth capacitor to the second capacitor.

17. The method of claim 16, further comprising the step of amplifying a difference between the pixel element reset value stored on the first capacitor and the sampled pixel signal value stored on the second capacitor.

* * * * *